(12) United States Patent
Goldfinch

(10) Patent No.: US 6,847,227 B2
(45) Date of Patent: Jan. 25, 2005

(54) METHODS AND APPARATUS FOR RECONFIGURING PROGRAMMABLE DEVICES

(75) Inventor: Jonathan Lasselet Goldfinch, High Peak (GB)

(73) Assignee: Anadigm Limited, Crewe (GB)

( * ) Notice: Subject to any disclaimer, the term of this patent is extended or adjusted under 35 U.S.C. 154(b) by 79 days.

(21) Appl. No.: 10/246,194

(22) Filed: Sep. 17, 2002

(65) Prior Publication Data

US 2003/0057996 A1 Mar. 27, 2003

(30) Foreign Application Priority Data

Sep. 18, 2001 (GB) .............................................. 0122477

(51) Int. Cl.⁷ .......................................... H03K 19/173
(52) U.S. Cl. .......................................... 326/38; 326/41
(58) Field of Search ..................................... 326/37–41

(56) References Cited

U.S. PATENT DOCUMENTS

| | | | |
|---|---|---|---|
| 5,329,179 A | 7/1994 | Tang et al. ................. | 307/465 |
| 5,457,408 A | 10/1995 | Leung ........................ | 326/38 |
| 5,748,982 A | 5/1998 | Smith et al. ................ | 395/829 |
| 5,751,163 A | 5/1998 | Tang et al. ................. | 326/38 |
| 5,760,607 A * | 6/1998 | Leeds et al. ................ | 326/38 |
| 5,838,167 A | 11/1998 | Erickson et al. ............ | 326/38 |
| 5,915,123 A | 6/1999 | Mirsky et al. .......... | 395/800.16 |
| 6,006,321 A * | 12/1999 | Abbott ....................... | 712/43 |
| RE37,195 E * | 5/2001 | Kean .......................... | 326/39 |
| 6,414,513 B1 | 7/2002 | Hanna et al. ............... | 326/38 |
| 6,573,748 B1 * | 6/2003 | Trimberger ................ | 326/38 |

* cited by examiner

*Primary Examiner*—Don Le
(74) *Attorney, Agent, or Firm*—Wells St. John P.S.

(57) ABSTRACT

There is disclosed a method for reconfiguring one or more programmable devices comprising the steps of:
- providing a datastream comprising one or more identification portions;
- loading data from the datastream into said one or more programmable devices thereby labelling the one or more programmable devices by loading one or more identification portions into each programmable device;
- presenting a reconfiguring datastream to the one or more programmable devices, the reconfiguring datastream comprising one or more data sections having an associated identification portion; and
- loading a data section into a programmable device if the identification portion associated with the data section matches an identification portion previously loaded in order to label the programmable device.

28 Claims, 1 Drawing Sheet

METHODS AND APPARATUS FOR RECONFIGURING PROGRAMMABLE DEVICES

PRIORITY CLAIM

This patent claims priority from earlier filed United Kingdom Patent Application No. GB 0122477.3, filed Sep. 18, 2001, entitled "Methods and Apparatus for Reconfiguring Programmable Devices", by Jonathan Lasselet Goldfinch.

TECHNICAL FIELD

This invention relates to methods and apparatus for reconfiguring one or more programmable devices, with particular, but by no means exclusive, reference to the reconfiguring of field programmable analogue arrays.

BACKGROUND OF THE INVENTION

Field programmable analogue arrays (FPAAs) are a relatively recent development in the electronics industry which enable a user to quickly and flexibly design and implement an extremely wide range of analog circuits. FIG. 1 shows an example of a FPAA comprising an array of individual, configurable analog blocks (CABs) 10 on a silicon chip 12. The CABs 10 may be based on switched capacitor circuit technology, using capacitors which are integrated on silicon. A CAB might comprise a switched capacitor CMOS op amp, a comparator, an array of capacitors, CMOS switches and SRAM. The configurable analog blocks 10 are interconnected with configurable connections 14.

Configurable Op amps 18, configurable band gap voltage references and other configurable analogue elements are also dispersed across the chip. Configurable I/O blocks 20 and other configurable elements are disposed on the periphery of the chip. Configuration of all the configurable elements on the chip is carried out using configuration logic 16. The configuration logic provides an interface to a configuration data source and implements a mechanism by which configuration data is loaded into configurable elements on the chip, thereby defining the functionality of the FPAA.

Thus, by inputting user controllable configuration data to the FPAA, the FPAA can be programmed to replicate the functions of a large number of analog components or circuits, for example rectifiers, sample and hold circuits, filters, and level detectors. However, it is not possible to replicate the function of all circuits using a single FPAA, due to the finite number of resources available on a single FPAA. In principle, it is possible to solve this problem by utilising a plurality of FPAAs interconnected in a "daisy chain". In practise, the problems associated with conveniently loading data into such a daisy chain arrangement of FPAAs have been little explored. In one known arrangement (Zetex FAS TRAC) a plurality of FPAAs are 'daisy chained', each FPAA having a clock input pin, a data input pin and a data output pin. The data output of the first device is connected to the data input of the second device, the data output of the second device is connected to the data input of the third device etc. and the clock pins are all connected together. To program the last device in the chain data must be clocked through every register stage in each of the previous devices. Thus data inputted into the n'th device in the chain will have been routed through each register in (n-1) devices. A considerable disadvantage with this approach is that the flow of data is slow.

In another known arrangement (Lattice ISPPac), a plurality of field programmable analogue devices are 'daisy chained' in a system in which each device is configured via a standard four pin JTAG interface. Following standard JTAG protocol, data to a particular device in a system must be clocked through a single register in each preceding device in a chain of JTAG devices. This introduces a pipelining latency. In a large system of devices this latency will affect the time taken to program a device.

Once a plurality of FPAA devices has been configured, it would be highly advantageous to be able to target specific devices, or groups of devices, for reprogramming or partial reprogramming, without the need to affect any of the other devices in the system, and without having to incur timing penalties such as those indicated above.

Such considerations apply not only to the proposed system of interconnected FPAAs, but also to multiple arrangements of other programmable devices, such as programmable logic devices, for example field programmable gated arrays (FPGAs). Methods have been developed to enable reprogramming (henceforth termed "reconfiguration") of such devices in a multiple device system, and are discussed below.

In a first method an array of devices are serially programmed and configured. A global REPROGRAM pin can then be asserted to initiate reprogramming of all the devices. This system is very inefficient because even if only one device in a chain requires configuring, all devices have to be reconfigured, since data passes serially through each device to the next.

A second method for configuration, used by ATMEL for configuring arrangements of FPGAs, and illustrated in the AT6000 series datasheet, allows reconfiguration of all devices in the system, partial configuration of individual devices and also allows partial reconfiguration of individual devices in the system. The method used involves the use of a state machine controlled data loading mechanism in each device, coupled with token-based chip select methodology. The first device is selected, data are loaded, and if no further data are to be loaded the state machine exits and passes control on to the next device by asserting the chip enable of the next device. The state machine of the next device processes the input data accordingly. The disadvantage with this method is that although the data are applied in parallel, control is passed serially, and there is therefore a pipelining latency if trying to reprogram individual devices in a chain.

Another method of configuration employed by ATMEL uses a state machine controlled data loading mechanism in each device, as above, but uses an address decoder to select devices individually, rather than relying on a chip select being passed from device to device. The disadvantage of this method is that a separate chip select line is required for each FPAA in a system, which increases routing problems on a printed circuit board, and, in addition, address decode circuitry is required.

A method that involves aspects of the two methods discussed above is known, in which configuration data passes through each device in series. Partial reconfiguration is supported by the state machine controlled data loading mechanism method as discussed in respect of the second prior art method. However, the method is limited by the problem of pipelining latency.

U.S. Pat. No. 5,457,408 and U.S. Pat. No. 5,329,179 describe methods for configuring a FPGA device in which the FPGA is hardwired with an identification code which enables the FPGA to selectively accept data intended for the FPGA.

In summary, although methods have been developed to allow reprogramming of all devices in a system or reprogramming of single devices in a system, a system does not yet appear to have been developed to allow limitless fast and flexible programming, reprogramming and partial reprogramming options for any, some or all devices in a system. Furthermore, prior art techniques are slow and suffer from pipelining latency or a requirement for multiple chip select lines.

Furthermore, it would be hugely desirable to improve the speed of reconfiguration since, as previously noted, the prior art techniques discussed above are inefficient.

The present invention addresses these problems and disadvantages.

SUMMARY OF THE INVENTION

According to a first aspect of the invention there is provided a method for reconfiguring one or more programmable devices comprising the steps of:

providing a datastream comprising one or more of identification portions;

loading data from the configuring datastream into said one or more programmable devices, thereby labelling the one or more programmable devices by loading one or more identification portions into each programmable device;

presenting a reconfiguring datastream to the one or more programmable devices, the reconfiguring datastream comprising one or more data sections having an associated identification portion; and loading a data section into a programmable device if the identification portion associated with the data section matches an identification portion previously loaded in order to label the programmable device.

In this way it is possible to reconfigure all or a selected subset of the programmable devices in a flexible, convenient and user defined manner. Devices can be reconfigured or partially reconfigured either singly or in parallel to others.

A plurality of programmable devices may be reconfigured, and the reconfiguring datastream may be presented in parallel to the plurality of programmable devices.

The programmable devices may load a unique device identification portion (or device ID (DID)). The reconfiguring datastream may comprise a data section containing one or more unique device identification portions. In this way a single programmable device in a system can be reconfigured conveniently.

The programmble devices may load at least one grouping identification portion (or grouping ID (GRID)) which is common to two or more of the programmable devices. The reconfiguring datastream may comprise a data section containing one or more grouping identification portions. In this way groups of programmable devices can be reconfigured together conveniently. The programmable devices may respond to, or load, a reserved, common universal identification portion (UID). The reconfiguring datastream may comprise a data section containing the common universal identification portion. In this way all programmable devices can be reconfigured together conveniently.

The step of providing a datastream may comprise connecting the plurality of programmable devices in parallel to one or more data lines. A single data line might be utilised, or multiple data lines, ie, a data bus, might be employed. The step of loading data from the datastream may comprise:

enabling a first programmable device to receive data from the one or more data lines;

loading data into the first programmable device;

enabling, across a first enable line, a second one of said plurality of programmable devices; and loading data into the second programmable device.

The method may further comprise the steps of:

signalling to a programmable device that the step of configuring said one or more programming devices has been completed; and thereafter adjusting the one or more programmable devices to treat a subsequent incoming datastream presented to the one or more programmable devices as a reconfiguring datastream.

The step of signalling may be performed by causing a state change on an input to the programmable device. An input of each programmable device may be connected to a common line which (i) is maintained at a first state by any programmable device which has not been configured and (ii) is maintained at a second state once all of the programmable devices have been configured.

The datastream may comprise a plurality of data sections having at least one identification byte. Other bytes such as synchronisation bytes, control bytes, configuration bytes, address bytes and JTAG ID bytes might be present as well.

The one or more programmable devices may comprise FPAA devices.

The one or more programmable devices may comprise FPGA devices.

According to a second aspect of the invention there is provided apparatus for reconfiguring one or more programmable devices comprising:

means for providing a datastream, the datastream comprising one or more identification portions;

means for configuring the plurality of programmable devices by loading data from the configuring datastream into said programmable devices;

means for labelling the one or more programmable devices by loading one or more identification portions into each programmable device;

means for presenting a reconfiguring datastream to the one or more programmable devices, the reconfiguring datastream comprising one or more data sections having an associated identification portion; and means for loading a data section into a programmable device if the identification portion associated with the data sections matches an identification portion previously loaded in order to label the programmable device.

The apparatus may be used for reconfiguring a plurality of programmable devices, in which instance the means for presenting a reconfiguring datastream may present in parallel the reconfiguring datastream to the plurality of programmable devices.

The means for providing a configuration datastream may comprise one or more datalines connected in parallel to the programmable devices. The means for labelling the plurality of programmable devices may comprise:

means for enabling the first programmable device to receive data from the one or more data lines; and means for enabling a second programmable device, comprising a first enable line connecting the first and second programmable devices.

A programmable device may comprise a state machine which processes data inputted into the programmable device and detects the presence of one or more identification portions in said data inputted into the programmable device. Other logical implementations may be used for this purpose.

The apparatus may comprise:

means for signalling to a programmable device that labelling of one or more programmable devices has been completed; and means for adjusting the one or more programmable devices to treat subsequent incoming datastream presented to the one or more programmable devices as a reconfiguring datastream.

A programmable device may comprise a state machine which recognises the signal that labelling has been completed, and thence ensures that a data section presented to the programmable device is loaded into same if an identification portion associated with the data section matches an identification portion previously loaded in order to label the programmable device. Other ways of processing the input data, ie, alternative forms of logic circuitry, are within the scope of the invention.

The means for signalling may cause a state change on an input to the programmable device when labelling has been completed. The apparatus may comprise a common signalling line connected to each programmable device which (i) is maintained at a first state by any programmable device which has not been labelled and (ii) is maintained at a second state once all of the programmable devices have been labelled.

The means for providing a datastream may provide a datastream comprising a plurality of configuring data sections having at least one identification byte. Other bytes, such as synchronisation bytes, control bytes, configuration data bytes, address bytes and JTAG ID bytes might be present as well.

The one or more programmable devices may comprise FPAA devices.

The one or more programmable devices may comprise FPGA devices.

Methods and apparatus in accordance with the invention will now be described with reference to the accompanying drawings, in which:

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. patent Laws "to promote the progress of science and useful arts" (Article 1, Section 8).

Figure 1:
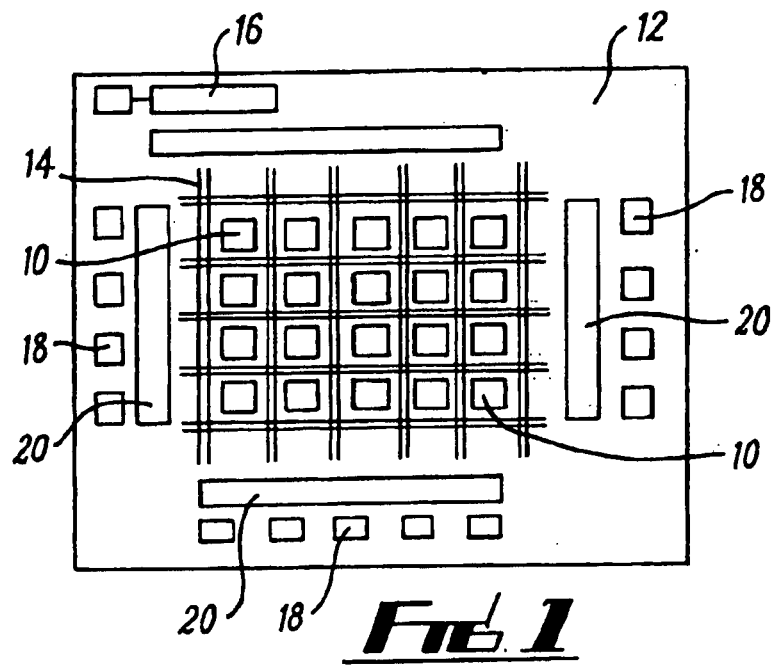
FIG. 1 is a schematic diagram of a single FPAA device.
Figure 2:
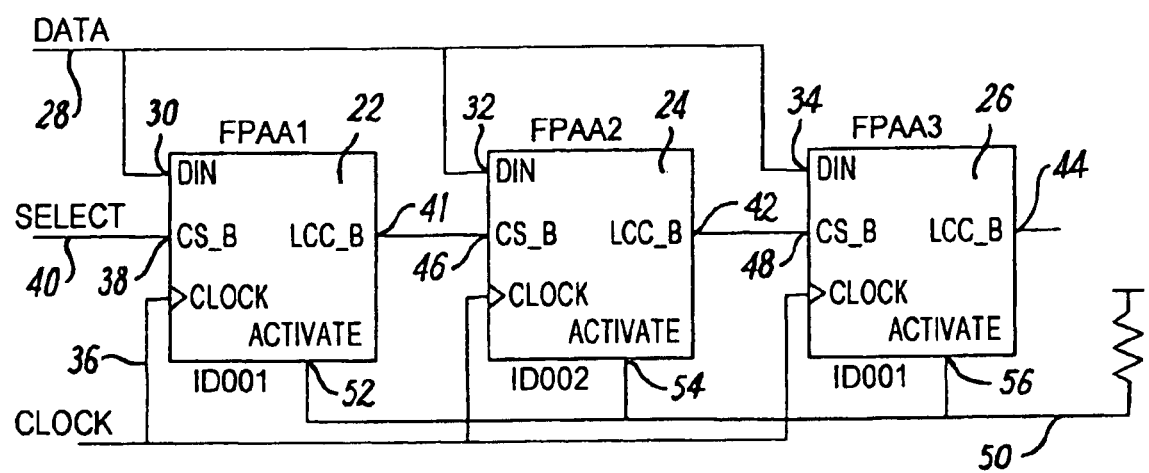
FIG. 2 is a schematic diagram of an apparatus according to the invention comprising a plurality of FPAA devices.

FIG. 2 shows block diagram of an embodiment of the invention. An arrangement of FPAA devices 22, 24, 26 are connected in parallel to a data line (or bus) 28 via DIN (data in pins) 30, 32, 34. It is, of course, possible to utilise more (or fewer) FPAA devices in the arrangement. Additionally, the FPAA devices 22, 24, 26 are connected in parallel to a configuration clock line (CLOCK) 36. The first FPAA device 22 has an ENABLE pin 38 which is connected to an ENABLE line 40. The data and first device enable functions are provided by a control arrangement (not shown), which might be an interface connected to a host device such as a microprocessor, microcontroller or personal computer. The clock function could also be provided by the host device or could alternatively be sourced from one of the FPAAs.

The FPAA devices 22, 24, 26 each comprise an output pin 41, 42, 44, herein after referred to as a LCC_B pin. The second FPAA device 24 has an enable pin 46 connected to the output pin 41 of the first FPAA device 22. The third FPAA device 26 has an enable pin 48 connected to the output pin 42 of the second FPAA device 24.

The arrangement further comprises a common signalling line 50, henceforth termed an ACTIVATE line, connected to each FPAA device 22, 24, 26 via an ACTIVATE pin 52, 54, 56 on each FPAA device.

In the system shown in FIG. 2, serial data (or parallel data) are applied in parallel to all of the FPAA devices 22, 24, 26 in the system. Each FPAA contains a state machine (not shown) which processes data on the DIN pin and which steps through states in synchronism with the signal on the clock pin. The state machine looks first for a synchronisation byte in the input data stream and subsequently processes the incoming data.

At power-up all FPAA's are automatically reset to a default state, and the state machines in each device begin operation. Also at power-up, LCC_B in each device is automatically set high, which deselects the following device and causes the internal state-machine of the following device to idle. In addition, the open drain ACTIVATE pin is pulled low by each device. In order to load data into the system a primary configuration sequence must be carried out.

Primary configuration is carried out in an ordered serial fashion. The SELECT pin to first FPAA device 22 is taken low and data are applied to all devices 22, 24, 26 in parallel. Since only the first device 22 is now selected, the other devices 24, 26 ignore the applied data. The applied bistream consists of catonated sections, one section per device, and each section begins with a synchronisation byte.

The applied data contain a synchronisation byte which is detected by the state-machine of the first FPAA device 22 and used by it to synchronise to byte boundaries in the incoming data stream. The incoming data follow a fixed order, and, importantly, one of the bytes presented is a primary ID byte which is written into an internal register and stored. The remaining data for the first FPAA device 22 are then presented, interpreted, and loaded into configuration memory. At the end of the loading process, the state machine for the first FPAA device 22 deasserts the LCC_B pin 41, which allows the state machine of the second FPAA device 24 to start. In addition the ACTIVATE pin 52 is released, and the state machine of the first FPAA device 22 then idles waiting for the ACTIVATE pin 52 to pull high. However, since all ACTIVATE pins 52, 54, 56 are tied together, the ACTIVATE line 50 remains pulled low by any device that remains unconfigured in the system. The state machine in the second FPAA device 24 now looks at the applied data, finds the synchronisation byte and loads the primary ID byte and configuration data as before. Once all of the data have been loaded, LCC_B pin 42 is deasserted (which enables the state machine in the third FPAA device 26) and the ACTIVATE pin 54 is released. The state machine of the second FPAA device 24 then idles waiting for the ACTIVATE pin 54 to pull high.

Next, the third FPAA device 26 configures in the same way as the first and second FPAA device 24, 26. Now, however, as soon as the ACTIVATE pin 56 on the third FPAA device 26 is released, the ACTIVATE pins 52, 54, 56 on each device can pull high, since there are no unconfigured devices holding the ACTIVATE line 50 low. When the ACTIVATE line 50 pulls high, the state machines in all three FPAA devices 22, 24, 26 switch simultaneously into a new reconfiguration phase where incoming data are treated as reconfiguration data. All three devices 22, 24, 26 are now selected and all three state machines are active.

It is quite possible that the functionality of one or more of the devices in the arrangement will require change or updating at some point. In this instance, device reconfiguration is required. During reconfiguration, data are presented to all devices in parallel. The data format is almost identical to primary configuration, with an ID byte, and with a synchronisation byte used to allow the state machines to synchronise to byte boundaries. However, in contrast to the configuration process, during reconfiguration all devices are enabled and all process the data in parallel, but only those devices which match the ID byte in the incoming data stream to the ID byte previously stored during primary configuration will actually load the data. In this way, reconfiguration can be targeted towards a particular device.

If the same device ID is given to two (or more) different devices during primary configuration, then it becomes possible to reconfigure both devices in parallel during reconfiguration. This is shown in the example depicted in FIG. 2, where the first and third FPAA devices 22, 26 are allocated an ID of 001.

A further level of flexibility has been added by the use of an additional "grouping" ID byte (GRID), which can be loaded during the initial configuration of the device or changed during reconfiguration. This approach allows a device to reconfigure in response to a match of the stored ID byte with the applied ID byte or a match of the applied ID byte with a stored "grouping" ID (GRID) byte. This allows global operations to be carried out. For example, if each device in a 10 device system is given a unique device ID but a common GRID, then, during reconfiguration, the user can reconfigure each device individually using the ID or reconfigure all the devices at once using the GRID. Alternatively, if each device in, for example, a 10 device system is given a unique device ID and the GRID for devices 1 to 4 is loaded with a unique value (value1) and the GRID for devices 5 to 10 is loaded with another unique value (value2), then, during reconfiguration, the user can reconfigure each device individually using the ID or can reconfigure devices 1 to 4 by supplying an ID containing value1 or can reconfigure devices 5 to 10 by supplying an ID containing value2. By making the GRID overwritable during reconfiguration of a device selected by ID, the user is able to change the grouping structure at will. It is also possible to extend the flexibility of grouping operations by reserving one ID which all devices respond to. This is known as the Universal ID or UID. When the applied ID matches the UID, all devices in the system will respond in parallel, allowing global programming changes to devices to be implemented. In one implementation the UID is fixed at 11111111, but this structure is not a unique one. It is also possible to extend the flexibility of grouping operations by having more than one grouping ID byte(GRID). Using this approach with two GRIDS, a device would be allowed to configure in response to a match of the stored ID byte with the applied ID byte or a match of the applied ID byte with the first stored GRID or a match of the applied ID byte with the second stored GRID. More than two GRIDS might be employed, or alternatively, a single GRID might be used. In the former case, if one GRID is made common to all devices, it behaves as a programmble UID.

A possible alternative implementation of the unique device ID byte is to allow it to be overwritten during reconfiguration. Though this would enable grouping to be implemented, it would not then be possible to return to the point where devices could be individually accessed. A system reset followed by primary configuration would be required to achieve this.

A non-limiting embodiment of a configuration bit-stream is now discussed.

During primary configuration a synch byte is sent first, followed by four JTAG ID bytes. If the JTAG ID bytes do not match those hardwired into the chip, then an error occurs. Otherwise, the ID byte is sent which will be stored and used later for reconfiguration. A control byte is then sent which sets up the device internally. Each bit of the control byte activates different functions in the device. Two address bytes are then sent which are used to indicate the starting address to which subsequent data bytes should be written. The number of data bytes to be written is then sent (NDBYTES) and this is followed by the data bytes themselves. After each data byte is written, the internal address counter is incremented, which means the next data byte is written to the next address. After all data bytes have been sent, two error check or cyclic redundancy check bytes are sent. These are compared to an internally generated error check word and, if no match occurs, an error is indicated.

If there is no error and a bit telling the device to expect another block of data has been set, then the device expects another block of data to be transmitted, and bytes are sent as indicated below. If the bit telling the device to expect another block of data was not set, then the device considers itself to be configured and awaits a synch byte. The ID byte is sent after a synch byte. If the ID byte matches the stored ID byte, then reconfiguration takes place and the device processes the incoming bytes accordingly, which follow exactly the same pattern as before. Note that the JTAG ID bytes are only ever sent during a primary configuration.

The non-limiting configuration bit-stream is shown below.

Note that a group ID byte or GRID would normally be written as a data byte to a specific address, and as such is not shown.

START
Preamble

| | |
|---|---|
| #<SYNCH BYTE> | 11010101 |
| <JTAG ID BYTE1> | only ever sent during primary configuration |
| <JTAG ID BYTE2> | only ever sent during primary configuration |
| <JTAG ID BYTE3> | only ever sent during primary configuration |
| <JTAG ID BYTE4> | only ever sent during primary configuration |
| #<DEVICE ID BYTE> | 00000001 |
| #<CTRL BYTE> | 11000010 |

Start of update 1

| | |
|---|---|
| #<ADDR1 BYTE> | 1/0/0/0/0001 |
| #<ADDR2 BYTE> | 00000000 |
| #<NDBYTES> | 00000010 |
| #<DATA BYTE1> | |
| ........... | |
| <DATA BYTE N> | |
| #<CRC BYTE1> | |
| #<CRC BYTE2> | |

End of update 1

.
.
Next update

-continued

| | |
|---|---|
| <ADDR BYTE1> | 1\|0\|0\|0\|0001 |
| <ADDR BYTE2> | 00000000 |
| <NDBYTES> | 00000010 |
| <DATA BYTE1> | |
| ........... | |
| <DATA BYTE2> | |
| <CRC BYTE1> | |
| <CRC BYTE2> | |
| End of update n | |
| . | |
| . | |
| FINISH | |

The ACTIVATE line and associated circuitry discussed above is used to provide an indication to all devices in a system that the last device has been configured and that all devices can move into reconfiguration mode together. A preferred implementation is to have an open drain activate pin on each device that are commoned together, with a pullup resistor also connected between the activate pin and vdd. Any device that has not configured will hold the line low. Only when all devices have configured will the activate line be able to pull high. This allows all devices to move into reconfiguration mode together.

An alternative technique might be to use an open drain activate pin on each device that are commoned together with a pulldown resistor also connected between the activate pin and vss. Now, any device that has not been configured will hold the line high. Only when all devices have configured will the activate line be able to pull low. This allows all devices to move into reconfiguration mode together.

Another method for implementing the activate functionality is to have an output pin (activate) on each device which goes high once the device is activated. A ready input pin would also be provided on each device. If the activate signals are all externally anded, then the output of the anding function will go high only when all activate signals are high. The output can be fed back to all the ready inputs which will be registered within each device allowing all devices to move into reconfiguration mode together. Note that if the activate outputs are arranged to go low once the device is activated, then the anding function would be replaced by a nor function (i.e only gives a high output when all inputs are low).

Another method for implementing the activate functionality would be to use a token system. In this method each device would have a ready input and activate output as before, but would also have an activate_in input. The activate output would go high only when the activate_in input of a device is high and the device has configured. Using this system, the activate output of the last device in a chain will only go high once all previous devices are configured. The activate output of the last device could be fed back to all ready inputs and would be registered within each device allowing all devices to move into reconfiguration mode together.

An alternative approach is to remove the activate_in signals altogether, and to feed the activate output of the last device in a chain back to all the ready pins. Thus only when the last device in a chain has become configured will the devices move into configuration mode together.

It should be noted that an identification portion can be defined by a single byte, or multiple bytes.

The present invention enables users to perform an ordered primary configuration of a single device or multiple devices, and then allows flexible and convenient reconfiguration or partial reconfiguration of any device in the system. It also allows devices to be reconfigured or partially reconfigured in parallel with others. The system can also allow the configuration process to define different groups or subgroups of devices which can be subsequently reconfigured together. The user can change this grouping at will.

It will be appreciated by the skilled reader that the examples provided above are not limiting, and that many alternative architectures and methods would readily suggest themselves. For example, other primary configuration methods might be employed in order to configure and load the identification portions into the devices. The use of a daisy chain enabling system during primary configuration, in which each device becomes active and is loaded with data, in turn, is preferred. However, data could be fed through previous devices in the chain, although a 'pipeline' delay in configuration and/or reconfigure would occur. Different techniques for appropriately enabling each device are well known to those skilled in the art: for example, the token based methodology discussed above, or the dual enable line technique disclosed in U.S. Pat. No. 5,640,106 and U.S. Pat. No. 5,838,167 might be employed. In principle, a single data line does not need to be applied in parallel to each of the devices, although it is the preferred method for reducing pin-count on a device. It would be entirely possible to apply multiple data lines, or a data bus, in parallel to each of the devices, and this would permit more efficient data transfer. Furthermore, other ways of signalling to the devices that configuration is completed, thereby allowing a reconfiguration mode to be entered, might be contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately Interpreted in accordance with the doctrine of equivalents.

The invention claimed is:

1. A method for reconfiguring one or more programmable devices comprising the steps of:

providing a datastream comprising one or more identification portions;

loading data from the datastream into said one or more programmable devices thereby labelling the one or more programmable devices by loading one or more identification portions into each programmable device;

presenting a reconfiguring datastream to the one or more programmable devices, the reconfiguring datastream comprising one or more data sections having an associated identification portion; and loading a data section into a programmable device if the identification portion associated with the data section matches an identification portion previously loaded in order to label the programmable device.

2. A method according to claim 1 in which a plurality of programmable devices are reconfigured, and the reconfiguring datastream is presented in parallel to the plurality of programmable devices.

3. A method according to claim 1 in which the programmable devices each load a unique device identification portion.

4. A method according to claim 1 in which the programmable devices load at least one grouping identification portion which is common to two or more of the programmable devices.

5. A method according to claim 2 in which the step of providing a datastream comprises connecting the plurality of programmable devices in parallel to one or more data lines.

6. A method according to claim 5 in which the step of loading data from the datastream comprises:
enabling a first programmable device to receive data from the one or more data lines;
loading data into the first programmable device;
enabling, across a first enable line, a second one of the said plurality of programmable devices; and
loading data into the second programmable device.

7. A method according to claim 1 further comprising the steps of:
signalling to a programmable device that the step of configuring said one or more programmable devices has been completed; and
thereafter adjusting the one or more programmable devices to treat a subsequent incoming datastream presented to the one or more programmable devices as a reconfiguring datastream.

8. A method according to claim 7 in which the step of signalling is performed by causing a state change on an input to the programmable device.

9. A method according to claim 8 in which an input of each programmable device is connected to a common line which (I) is maintained at a first state by any programmable device which has not been configured and (ii) is maintained at a second state once all of the programmable devices have been configured.

10. A method according to claim 1 in which the datastream comprises a plurality of configuring data sections containing at least one identification byte.

11. A method according to claim 1 in which the one or more programmable devices comprise FPAA devices.

12. A method according to claim 1 in which the one or more programmable devices comprise FPGA devices.

13. Apparatus for reconfiguring one or more programmable devices comprising:
means for providing a datastream, the datastream comprising one or more identification portions;
means for labelling the one or more programmable devices by loading one or more identification portions into each programmable device;
means for presenting a reconfiguring datastream to the one or more programmable devices, the reconfiguring datastream comprising one or more data sections having an associated identification portion; and
means for loading a data section into a programmable device if the identification portion associated with the data section matches an identification portion previously loaded in order to label the programmable device.

14. Apparatus for reconfiguring a plurality of programmable devices according to claim 13 in which the means for presenting a reconfiguring datastream presents in parallel the reconfiguring datastream to the plurality of programmable devices.

15. Apparatus according to claim 14 in which the means for providing a datastream comprises one or more data lines connected in parallel to the programmable devices.

16. Apparatus according to claim 15 in which the means for labelling the plurality of programmable devices comprises:
means for enabling a first programmable device to receive data from the one or more data lines; and
means for enabling a second programmable device, comprising a first enable line connecting to first and second programmable devices.

17. Apparatus according to claim 13 in which a programmable device comprises a statemachine which processes data inputted into the programmable device and detects the presence of one or more identification portions in said data inputted into the programmable device.

18. Apparatus according to claim 13 comprising:
means for signalling to a programmable device that labelling of said one or more programmable devices has been completed; and
means for adjusting the one or more programmable devices to treat a subsequent incoming datastream presented to the one or more programmable devices as a reconfiguring datastream.

19. Apparatus according to claim 18 in which a programmable device comprises a statemachine which recognizes the signal that labelling has been completed, and thence ensures that a data section presented to the programmable device is loaded into same if an identification portion associated with the data section matches an identification portion previously loaded in order to label the programmable device.

20. Apparatus according to claim 18 in which the means for signalling causes a state change on an input to a programmable device when labelling has been completed.

21. Apparatus according to claim 20 comprising a common signalling line connected to each programmable device which (I) is maintained at a first state by any programmable device which has not been labelled and (ii) is maintained at a second state once all of the programmable devices have been labelled.

22. Apparatus according to claim 13 in which the means for providing a datastream provides a datastream comprising a plurality of configuring data sections containing at least one identification byte.

23. Apparatus according to claim 13 in which the one or more programmable devices comprise FPAA devices.

24. Apparatus according to claim 13 in which the one or more programmable devices comprise FPGA devices.

25. A method for reconfiguring a programmable device comprising:
providing a datastream comprising an identification portion to the programmable device;
first loading the programmable device, among a plurality of programmable devices, with the identification portion to label the programmable device;
providing a reconfiguring datastream to the programmable device, the reconfiguring datastream comprising a data section and an associated identification section; and
second loading the programmable device with the data section if the identification section matches the identification portion loaded into the programmable device, and wherein the programmable device is loaded with a group identification portion that is common to a plurality of programmable device.

26. The method of claim 25 wherein the first loading further comprises loading a grouping identification portion that is common to two or more programmable devices among the plurality of programmable devices.

27. The method of claim 25 wherein the reconfiguring datastream is provided in parallel to the plurality of programmable devices, but the second loading the programmable device with the data section is performed if the identification section matches the identification portion loaded into the programmable device.

28. Apparatus for reconfiguring a programmable device comprising:

means for labelling the programmable device, among a plurality of programmable devices, by loading the programmable device with an identification portion included in a datastream;

means for providing a reconfiguring datastream to the programmable device, the reconfiguring datastream comprising a data section and an associated identification section; and means for loading the programmable device with the data section if the identification section matches the identification portion loaded into the programmable device, and wherein the programmable device includes a state machine configured to process data inputted into the programmable device.

* * * * *

UNITED STATES PATENT AND TRADEMARK OFFICE
CERTIFICATE OF CORRECTION

PATENT NO. : 6,847,227 B2
DATED : January 25, 2005
INVENTOR(S) : Jonathan Lasselet Goldfinch It is certified that error appears in the above-identified patent and that said Letters Patent is hereby corrected as shown below:

Column 5,
Lines 36-38, the paragraph beginning "Methods and apparatus in accordance with the invention ..." should appear beginning on line 57 as the second paragraph under the section entitled "Brief Description of the Drawings".

Column 11,
Line 28, delete "which (I) is maintained", and insert -- which (i) is maintained --.

Column 12,
Line 30, delete "which (I) is maintained", and insert -- which (i) is maintained --.
Line 59, delete "programmable device", and insert -- programmable devices --.

Signed and Sealed this

Seventeenth Day of May, 2005

JON W. DUDAS
*Director of the United States Patent and Trademark Office*